United States Patent
Ellis et al.

(10) Patent No.: US 6,413,576 B1
(45) Date of Patent: *Jul. 2, 2002

(54) SEMICONDUCTOR COPPER BOND PAD SURFACE PROTECTION

(75) Inventors: Timothy W. Ellis, Doylestown; Nikhil Murdeshwar, Abington; Mark A. Eshelman, Lansdale; Christian Rheault, Willow Grove, all of PA (US)

(73) Assignee: Kulicke & Soffa Investments, Inc., Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/412,542

(22) Filed: Oct. 5, 1999

Related U.S. Application Data

(63) Continuation-in-part of application No. 09/330,906, filed on Jun. 11, 1999.
(60) Provisional application No. 60/103,032, filed on Oct. 5, 1998, provisional application No. 60/127,249, filed on Mar. 31, 1999, and provisional application No. 60/146,674, filed on Aug. 2, 1999.

(51) Int. Cl.[7] .............................. B05D 5/12; H01L 21/44
(52) U.S. Cl. ............................ 427/96; 427/99; 427/118; 427/124; 427/126.2; 29/832; 204/192.1; 438/612
(58) Field of Search .............................. 427/56, 96, 99, 427/117, 118, 124, 126.2, 250, 255.19, 255.393, 255.394; 204/192.1; 29/832; 438/612

(56) References Cited

U.S. PATENT DOCUMENTS

| | | | |
|---|---|---|---|
| 5,272,376 A | * 12/1993 | Ueno | 257/737 |
| 5,771,157 A | 6/1998 | Zak | 361/760 |
| 5,785,236 A | 7/1998 | Cheung et al. | 228/180.5 |

* cited by examiner

*Primary Examiner*—Brian K. Talbot
(74) *Attorney, Agent, or Firm*—Synnestvedt & Lechner LLP

(57) ABSTRACT

Methods for protecting the surface of an uninsulated portion of a copper circuit from environmental contamination detrimental to joining the surface to another metal surface, said method comprising the step of coating the surface with a layer of a ceramic material having a thickness that is suitable for soldering without fluxing and that is sufficiently frangible when the surfaces are being joined to obtain metal-to-metal contact between the surfaces. Coated electronic packages including semiconductor wafers are also disclosed.

25 Claims, 1 Drawing Sheet

SEMICONDUCTOR COPPER BOND PAD SURFACE PROTECTION

CROSS REFERENCE TO RELATED APPLICATIONS

This application claims priority from U.S. Provisional Patent Application No. 60/103,032 filed Oct. 5, 1998, No. 60/127,249 filed Mar. 31, 1999, and No. 60/146,674 filed Aug. 2, 1999, and is a Continuation-In-Part of U.S. patent application Ser. No. 09/330,906 filed Jun. 11, 1999 still pending. The disclosures of all four applications are incorporated herein by reference.

BACKGROUND OF THE INVENTION

The present invention relates to methods for protecting semiconductor copper bond pad surfaces with ceramic coatings that are sufficiently frangible during ball, wedge or flip chip bonding to obtain metal-to-metal contact between the bonding surfaces and the wires bonded thereto. The method protects the copper bond pads during extended exposure to water and water solutions such as are experienced during sawing.

The use of copper bond pads on semiconductor devices would be an attractive alternative to that of aluminum, were it not for atmospheric contamination of the copper surface, which oxidizes readily to form a coating that is not removable by standard methods of wire bonding machines, and requires the use of fluxes in solder-type interconnects, e.g., flip chip bonding. Present attempts to overcome this problem involve the use of a cover gas that is unavoidably expensive and complex and restricts bond head and work holder movement, or the use of a noble metal or overplating with inert metals which are more costly and can lead to the formation of unwanted intermetallic compounds at the bond pad interface.

U.S. Pat. No. 5,771,157 encapsulates a wedge bond of an aluminum wire to a copper pad with the resin, after the bond is formed. No protection against oxidation is provided to the copper pad prior to wedge bonding.

U.S. Pat. No. 5,785,236 protects a copper bond pad from oxidation with a surface layer of aluminum. This detracts from the advantages sought to be obtained by replacing aluminum bond pads with copper bond pads.

There remains a need for methods by which copper bond pad surfaces may be protected from oxidation prior to wire bonding or flip chip soldering.

SUMMARY OF THE INVENTION

This need is met by the present invention. Ceramic coatings have now been developed for the bonding surfaces of copper bond pads that are sufficiently frangible to obtain metal-to-metal contact between the bonding surface and the wire bonded thereto during ball or wedge wire bonding, and to obtain a surface suitable for soldering without fluxing.

It has also been discovered that the same ceramic coatings can be generally used to protect the copper surfaces of electronic packages. That is, the present invention provides ceramic coatings for the protection of the copper surfaces of organic substrate packages, metal substrate packages ceramic substrate packages, and the like.

According to one aspect of the present invention, a method is provided for protecting the surface of an uninsulated portion of a copper circuit from environmental contamination detrimental to joining the surface to another metal surface, wherein the method includes the step of coating the surface with a layer of a ceramic material having a thickness that is suitable for soldering without fluxing and that is sufficiently frangible when the surfaces are being joined to obtain metal-to-metal contact between the surfaces.

The invention is particularly suited to protecting the bonding surfaces of copper bond pads. Therefore, in a preferred embodiment of the present invention, the uninsulated portion of the copper circuit is the bonding surface of a copper semiconductor bond pad.

The present invention thus provides electronic packages having uninsulated copper circuit surfaces with coating layers that are capable of being removed at bonding or soldering. Therefore, according to another aspect of the present invention, an electronic package is provided containing at least one uninsulated copper surface coated with a layer of a ceramic material having a thickness that is suitable for soldering without fluxing and which provides the layer with the aforementioned hardness. In a preferred embodiment, the electronic package is a semiconductor with uninsulated copper bond pads.

This aspect of the present invention includes electronic packages having uninsulated portions of copper circuits coated with a layer of rare earth metals that form complexes with copper. The layer has a thickness that, upon formation of the copper complex and exposure to a reducing environment containing hydrogen, forms a ceramic hydride layer having a thickness that is suitable for soldering without fluxing and which provides the layer with the aforementioned hardness.

This aspect of the present invention thus also includes electronic packages having uninsulated portions of copper circuits with protective ceramic metal hydride coatings. Therefore, according to another aspect of the present invention, an electronic package is provided containing an uninsulated portion of a copper circuit coated with a surface layer of a metal hydride compound selected from metal hydrides of copper-rare earth metal complexes and metal hydrides of copper-immiscible metals that form metal hydrides, in which the surface layer has a thickness that is suitable for soldering without fluxing and which provides the layer with the aforementioned hardness. Again the preferred electronic package is a semiconductor having at least one copper bond pad.

The inventive method provides the ability to bond wires to copper circuits using existing equipment without modification of the wire bonder, and without additional costs and limitations of cover gas technology and hardware. The foregoing and other objects, features, and advantages of the present invention are more readily apparent from the detailed description of the preferred embodiments set forth below, taken in conjunction with the accompanying drawing.

BRIEF DESCRIPTION OF THE DRAWING

The sole drawing FIGURE is a schematic diagram of one method according to the present invention, in which semiconductor devices according to the present invention having copper bond pads with bonding surfaces coated with hydride-forming materials and metal hydrides are also depicted.

DETAILED DESCRIPTION OF THE PREFERRED EMBODIMENT

Figure 1:
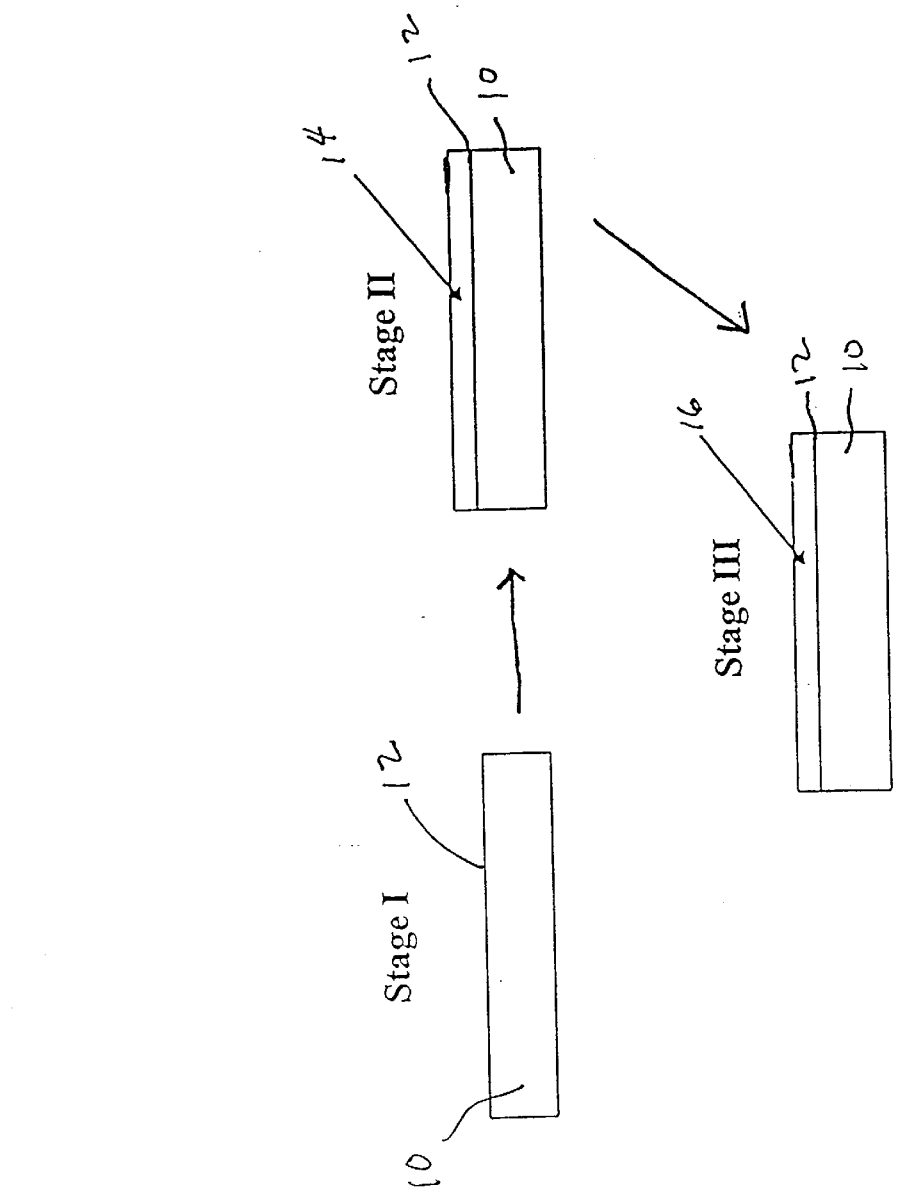

The present invention forms protective ceramic coating layers on copper circuit bonding surfaces of electronic packages, with thicknesses that are suitable for soldering without fluxing. The ceramic layer thickness is selected to provide at least the minimum hardness required for the layer to be sufficiently frangible during ball or wedge wire bonding to obtain metal-to-metal contact between each bonding surface and the wire bonded thereto.

Ceramic, rather than metallic, coatings are employed because metallic layers would be ductile and would plastically deform under impact. Because ceramic materials cannot be deformed in the plastic region, impact shatters the layer and allows it to be pushed aside during wire bonding.

Essentially all commonly used ceramic materials have a hardness suitable for use with the present invention. One measure of ceramic hardness is the Rockwell Superficial Hardness Scale (45-N) which is defined in Somiya, *Advanced Technical Ceramics* (Prentice Hall, Englewood Cliffs, N.J. 1996). Ceramic materials suitable for use with the present invention have a Rockwell Hardness (N-45) greater than about 38.

For purposes of the present invention, the meaning of the term ceramic materials is adopted as it is defined in Callister, *Materials Science and Engineering, An Introduction* (3rd Ed., John Wiley & Sons, New York 1994), page 4. Callister defines ceramic materials as compounds between metallic and nonmetallic elements that are most frequently oxides, nitrides and carbides. Ceramic materials within this classification include materials composed of clay minerals, cement and glass. Ceramic materials are insulative to the passage of electricity and heat, and are more resistant to high temperatures and harsh environments than metals and polymers. As for mechanical behavior, ceramic materials are hard but very brittle.

One method and apparatus of the present invention is depicted in the sole drawing figure, in which bonding surface 12 of copper bond pad 10 of a semiconductor device (not shown) is cleaned (Stage I). If the copper surface is fresh and has not been exposed to a contaminating atmosphere, Stage I cleaning is not required. In the depicted embodiment, the bonding surface 12 is coated with a layer 14 of a hydride-forming copper-immiscible metal or copper-complexing rare earth metal (Stage II). For proper coating of surface layer 14, it is necessary to reduce the oxides, hydroxides and sulfides that form on the surface 12 of pad 10. Only after this reduction is complete can proper surface coating be performed. The surface 12 can be reduced by exposure to a reducing atmosphere, such as an atmosphere containing hydrogen, or by essentially any other conventional surface reducing techniques, including cleaning techniques such as plasma cleaning.

Examples of metals that are completely immiscible in copper include, but are not limited to, Ta, V and Nb. Examples of rare earth metals that complex with copper include, but are not limited to, La, Y, and Ce.

The surface 12 of copper pad 10 is coated with metal layer 14 by conventional vapor deposition or analogous techniques. The rare earth metals may require a heating step after deposition for the copper complex to form.

Surface layers of copper-immiscible hydride-forming metals can be formed by an alternative route. The copper-immiscible metal may be co-deposited with the copper as the copper bond pads are formed during wafer fabrication. By heating the wafers after fabrication, the co-deposited immiscible metal will migrate to the surface of the copper bond pad, forming an oxidation-protective layer. Electroless or electrodeposition techniques may also be employed.

The deposited layer 14 should be of a thickness capable of forming a frangible hydride layer. That is, the resulting ceramic layer should have a thickness sufficient to provide the layer with a Rockwell Hardness (N-45) greater than about 38. Suitable ceramic layers have a thickness between about 10 and about 1,000 angstroms, with a thickness between about 25 and about 500 angstroms being preferred.

When a rare earth metal is employed, it is preferably deposited in a layer thin enough to form an essentially pure copper complex. This can be accomplished using rare earth metal layers with thickness from about 10 to about 1,000 Angstroms.

Copper-immiscible metal layers are preferably thin enough to be cost competitive and permit ease of fabrication. For these purposes, the layer 12 should be no thicker than 1/10 the total combined thickness of the pad 10 and layer 14. A thickness from about 10 to about 1,000 Angstroms is preferred.

Layer 14 is then converted to a hydride layer (Stage III) by reduction with hydrogen, either by heating the bond pad in an atmosphere containing hydrogen, or by exposing the bond pad to a hydrogen-containing plasma, e.g., plasma-cleaning operations. Once formed, the hydride layer 16 is stable at room temperature. It is not necessary for deposition or hydride conversion of the layer 14 to be performed at the time of wafer fabrication. Both processes can be done at a later time. As noted above, for proper deposition of the layer 14, the surface 12 of bond pad 10 must be cleaned prior to deposition.

The hydride-formation step can take place at any stage prior to wire bonding or flip chip bonding, so long as the reducing environment is sufficiently aggressive enough to reduce the layer 14 to remove any atmospheric contamination. Suitable reducing conditions can be readily determined by those of ordinary skill in the art without undue experimentation.

The hydride layer 16 provides the surface 12 of bond pad 10 with oxidation resistance. Yet, because the hydride layer is frangible, conventional ball or wedge wire bonding can be performed to obtain metal-to-metal contact between surface 12 and the wire bonded thereto (not shown), which also provides a surface prepared for soldering operations.

The hydride compound rapidly disintegrates during wire bonding or soldering by two mechanisms. One mechanism is mechanical, and derives from the frangibility of the hydride layer. The hydride will also thermally de-hydride during bonding, forming a hydrogen cover over the bond pad itself, which also prevents oxidation.

It is not necessary for the hydride process to be performed at the time of wafer fabrication. The hydride process can take place at any stage prior to wire bonding or soldering, so long as the hydrogen-containing atmosphere is sufficiently aggressive enough to reduce any contaminants from the surface layer, and then subsequently hydride the surface layer.

The present invention also includes a single-step process in which the frangible ceramic coating is not a metal hydride. Instead, a clean copper bond pad is coated with a layer of a ceramic material having a thickness that is suitable for soldering without fluxing and that provides the layer with a Rcokwell Hardness (N-45) greater than about 38, so that the layer is sufficiently frangible during ball or wedge wire bonding to obtain metal-to-metal contact between each bonding surface and the wire bonded thereto.

Examples of suitable ceramic materials include nitrides and carbides of silicon, titanium and tantalum; oxides of aluminum, magnesium and zirconium; silicon and titanium dioxide; tungsten and boron carbide; and cubic boron nitride and diamond.

These coating layers are also formed by conventional vapor deposition or analogous techniques.

The present invention can also be employed to coat the uninsulated surfaces of copper circuits other than the bond pads of semiconductors, using the same materials and method steps Thus, the same ceramic coatings can be used to protect prior to bonding the uninsulated copper circuit surfaces of organic substrate packages such as Polymer Ball Grid Arrays (PBGA), Enhanced Polymer Ball Grid Arrays (EPBGA), Tape Ball Grid Arrays (TBGA), and the like; metal substrate packages such as Metal Quad Flat Packs (MQFP), Metal Leaded Chip Carriers (MLCC), Thin Small Outline Packages (TSOP), and the like; and ceramic substrate packages such as Ceramic Quad Flat Packs (CQFP), Ceramic Dual Inline Packages (CDIP), Leaderless Ceramic Chip Carriers (LCCC), and the like.

The present invention provides the uninsulated copper circuit portions of electronic packages with oxidation-resistant surfaces that can be ball or wedge wire bonded using conventional techniques without changes or additions to current ball and wedge wire bonding or flip chip bonding processes and equipment.

The following non-limiting example set forth hereinbelow illustrates certain aspects of the invention, but is not meant in any way to restrict the effective scope of the invention. All parts and percentages are by weight unless otherwise noted, and all temperatures are in degree Celsius.

EXAMPLE

Copper wafers having a copper thickness of at least 2,000 angstroms were made via vapor deposition. Frangible ceramic coatings of silicon nitride with thicknesses between 10 and 1,000 angstroms were formed via sputtering techniques.

Wire ball bonding was performed using various gold wires and a K&S Model 8020 wire bonder. The following wire bond process conditions were employed:

Constant velocity=0.25–1.0 mil/msec.

Ultra sonic level=35–250 mAmp or equivalent power or voltage setting

Bond time=5–50 msec.

Bond force=10–40 g

Free air ball diameter=1.4–3.0 mil

A variety of gold wire types were attempted and all were found to be readily bondable: AFW-8, AFW-14, AFW-88, AFW-FP and AFW-FP2. The harder wires, AFW-FP and AFW-FP2, performed the best.

A variety of bonding tools (capillaries) were used and all were found to yield bondability in the bonded ball regions for which the capillaries were designed. The best performing capillaries were part numbers 414FA-2146-335 and 484FD-2053-335.

Copper wire was also bonded to the ceramic-coated bond pads. An inert cover gas was employed for ball formation. The bond parameters were not identical for those of gold for the same bonded ball size, but the bond parameter range was not widely different for the range for gold ball bonding onto copper substrates.

The foregoing description of the preferred embodiments should be taken as illustrating, rather than as limiting, the present invention as defined by the claims. Numerous variations and combinations of the features set forth above can be utilized without departing from the presently-claimed invention. Such variations should not be regarded as a departure from the spirit and scope of the invention, and are intended to be included within the scope of the following claims.

What is claimed is:

1. A method for protecting the uninsulated portion of a copper circuit formed on the surface of an electronic package substrate from contamination detrimental to joining said uninsulated portion of said copper circuit to another metal surface, said method consisting essentially of the step of directly coating an electronic package substrate surface on which a copper circuit comprising an uninsulated portion has been formed with a layer consisting essentially of a ceramic material having a thickness that is suitable for soldering without fluxing and that is sufficiently frangible when said uninsulated portion of said copper circuit is being joined to another metal surface to obtain metal-to-metal contact therebetween.

2. The method of claim 1, wherein said uninsulated portion of said copper circuit is the bonding surface of a copper semiconductor bond pad and said ceramic material has a thickness that is sufficiently frangible during ball or wedge wire bonding to obtain metal-to-metal contact between the bonding surface and the wire bonded thereto.

3. The method of claim 1, wherein the thickness of said ceramic layer provides said layer with a Rockwell Hardness (N45) greater than about 38.

4. The method of claim 1, wherein said ceramic layer has a thickness between about 10 and about 1000 angstroms.

5. The method of claim 1, wherein said ceramic material is selected from the group consisting of silicon nitride, silicon carbide, titanium nitride, tantalum nitride, aluminum oxide, magnesium oxide, silicon dioxide, titanium dioxide, zirconium oxide, tantalum carbide, tungsten carbide, titanium carbide, boron carbide, cubic boron nitride and diamond.

6. A method for protecting the uninsulated portion of a copper circuit formed on the surface of an electronic package substrate from contamination detrimental to joining said uninsulated portion of said copper circuit to another metal surface, said method, comprising coating said uninsulated portion of said copper circuit with a hydride-forming layer of a material selected from the group consisting of rare earth-copper complexes and copper immiscible metals; and exposing said hydride-forming layer to a hydrogen-containing reducing environment to form a metal hydride surface layer;

wherein said hydride-forming layer is of a thickness that forms a metal hydride surface layer that is suitable for soldering without fluxing and that is sufficiently frangible when said uninsulated portion of said copper circuit is being joined to another metal surface to obtain metal-to-metal contact therebetween.

7. The method of claim 6, wherein said metal hydride-forming layer is coated on said uninsulated portion of said copper circuit immediately before exposure to said reducing environment.

8. The method of claim 6, wherein said step of exposing said hydride-forming layer to said reducing environment comprises the step of heating said hydride forming layer in a reducing atmosphere comprising hydrogen or contacting said hydride-forming layer with a hydrogen-containing plasma.

9. The method of claim 6, wherein said hydride-forming layer is coated on said uninsulated portion of said copper circuit by electrodeposition or chemical deposition.

10. The method of claim 6, wherein said hydride-forming layer is coated on said uninsulated portion of said copper circuit by vapor deposition.

11. The method of claim 9, wherein said hydride-forming layer comprises a copper-rare earth metal complex that is formed by electrodeposition or chemical deposition onto said uninsulated portion of said copper circuit of a rare earth metal layer that forms a copper complex and said method further includes the step of heating said deposited rare earth metal layer to form said copper complex.

12. The method of claim 11, wherein said hydride-forming layer consists essentially of said copper-rare earth metal complex.

13. The method of claim 6, wherein said hydride-forming layer consists essentially of said copper-immiscible metal.

14. The method of claim 13, wherein said hydride-forming layer consisting essentially of said copper-immiscible metal is formed by co-deposition of copper with said copper-immiscible metal followed by heating so that said copper-immiscible metal migrates to the bonding surface to form said hydride-forming layer.

15. The method of claim 13, wherein said hydride-forming layer has a thickness substantially less than 20 percent of the combined total thickness of said uninsulated portion of said copper circuit and said hydride-forming layer.

16. The method of claim 1, wherein said ceramic material is a hydride of a rare earth-copper complex or a copper-immiscible metal.

17. The method of claim 1, further comprising the step of bonding or soldering another metal surface to said uninsulated portion of said copper circuit through said ceramic layer.

18. The method of claim 6, further comprising the step of bonding or soldering another metal surface to said uninsulated portion of said copper circuit through said metal hydride surface layer.

19. A method for obtaining metal-to-metal contact between the uninsulated portion of a copper circuit formed on the surface of an electronic package substrate and another metal surface consisting essentially of:

directly coating an electronic package substrate surface on which a copper circuit comprising an uninsulated portion has been formed with a layer consisting essentially of a ceramic material having a thickness that is suitable for soldering without fluxing and that is sufficiently frangible when said uninsulated portion of said copper circuit is being joined to another metal surface to obtain metal-to-metal contact therebetween; and bonding or soldering another metal surface to said uninsulated portion of said copper circuit through said ceramic layer.

20. The method of claim 19, wherein the thickness of said ceramic layer provides said layer with a Rockwell Hardness (N45) greater than about 38.

21. The method of claim 19, wherein said ceramic layer has a thickness between about 10 and about 1000 angstroms.

22. The method of claim 19, wherein said ceramic material is selected from the group consisting of silicon nitride, silicon carbide, titanium nitride, tantalum nitride, aluminum oxide, magnesium oxide, silicon dioxide, titanium dioxide, zirconium oxide, tantalum carbide, tungsten carbide, titanium carbide, boron carbide, cubic boron nitride and diamond.

23. The method of claim 19, wherein said ceramic material is a hydride of a rare earth-copper complex or a copper immiscible metal.

24. A method for obtaining metal-to-metal contact between the uninsulated portion of a copper circuit formed on the surface of an electronic package substrate and another metal surface, comprising:

coating said uninsulated portion of said copper circuit with a hydride-forming layer of a material selected from the group consisting of rare earth-copper complexes and copper-immiscible metals; and exposing said hydride-forming layer to a hydrogen-containing reducing environment to form a metal hydride surface layer;

wherein said hydride-forming layer is of a thickness that forms a metal hydride surface layer that is suitable for soldering without fluxing and that is sufficiently frangible when said uninsulated portion of said copper circuit is being joined to another metal surface to obtain metal-to-metal contact therebetween; and bonding or soldering another metal surface to said uninsulated portion of said copper circuit through said metal hydride surface layer.

25. The method of claim 24, wherein said hydride-forming layer has a thickness substantially less than 20 percent of the combined total thickness of said uninsulated portion of said copper circuit and said hydride-forming layer.

* * * * *